United States Patent
Wu (10) Patent No.: US 7,662,962 B2
(45) Date of Patent: Feb. 16, 2010

(54) ORGANOMETALLIC COMPLEX AND ORGANIC LIGHT-EMITTING DIODES AND DISPLAYS COMPRISING THE SAME

(75) Inventor: Pei-Chi Wu, Kaohsiung (TW)

(73) Assignee: AU Optronics Corp., Hsinchu (TW)

( * ) Notice: Subject to any disclaimer, the term of this patent is extended or adjusted under 35 U.S.C. 154(b) by 671 days.

(21) Appl. No.: 11/123,280

(22) Filed: May 6, 2005

(65) Prior Publication Data

US 2006/0216542 A1    Sep. 28, 2006

(30) Foreign Application Priority Data

Mar. 23, 2005    (TW) .............. 94108927 A (51) Int. Cl.
*C09K 11/06* (2006.01)
*H01L 51/54* (2006.01)
(52) U.S. Cl. .............. 546/2; 546/10; 548/101; 428/917; 313/504; 257/E51.044
(58) Field of Classification Search .............. None
See application file for complete search history.

(56) References Cited

U.S. PATENT DOCUMENTS

| 6,565,994 B2 * | 5/2003 | Igarashi .............. 428/690 |
| 6,605,201 B1 * | 8/2003 | Mao et al. .............. 204/403.14 |
| 2002/0134984 A1 * | 9/2002 | Igarashi .............. 257/79 |

OTHER PUBLICATIONS

Minghetti et al., "Metal Derivatives of Azoles. Part 4. Platinum(II) and Palladium(II) Complexes", J.C.S. Dalton Trans., pp. 1851-1856 (1979).*

Connick et al., "Lowest Electronic Excited States of Platinum(II) Diimine Complexes", Inorg. Chem. 39(12), pp. 2585-2592 (2000).*

* cited by examiner

*Primary Examiner*—Marie R. Yamnitzky
(74) *Attorney, Agent, or Firm*—Thomas, Kayden, Horstemeyer & Risley (57) ABSTRACT

An organometallic complex. The organometallic complex has formula (I)

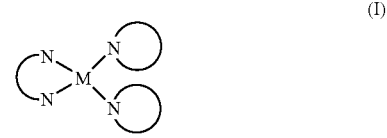

(I)

, wherein M is a transition metal with an atomic number greater than 40 comprising Ir, Os, Pt, Pd, Re, or Ru,

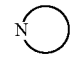

is a substituted or non-substituted heterocyclic ring containing at least one nitrogen atom, and

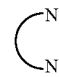

is any bidentate ligand comprising bipyridyl groups. The invention also provides an organic light-emitting diode and a display including the organometallic complex.

13 Claims, 4 Drawing Sheets

ORGANOMETALLIC COMPLEX AND ORGANIC LIGHT-EMITTING DIODES AND DISPLAYS COMPRISING THE SAME

BACKGROUND

The present invention relates to an organometallic complex, and more specifically to an organometallic complex used in an organic light-emitting diode.

Organic electroluminescent devices are popular in flat panel display due to their high illumination, light weight, self-illumination, low power consumption, simple fabrication, rapid response time, wide viewing angle, and no backlight requirement.

When an external electric field is applied to an organic electroluminescent device, electrons and holes are injected from cathode and anode, respectively, and then recombined to form excitons. Energy is further transported from excitons to luminescent molecules with continuous application of an electric field. Finally, luminescent molecules emit light converted from energy. A common organic electroluminescent device structure comprises an ITO anode, a hole transport layer, an emitting layer, a hole blocking layer, an electron transport layer, and a cathode. A complex organic electroluminescent device, however, may further comprise a hole injection layer disposed between an anode and a hole transport layer or an electron injection layer disposed between a cathode and an electron transport layer to improve injection efficiency of carriers, reducing driving voltage or increasing recombination thereof.

With development of synthesis techniques, various synthetic organic compounds for use in organic electroluminescent devices have been provided. Such luminescent materials are fluorescent and phosphorescent materials. Generally, phosphorescent materials are composed of transition metal complexes. Due to heavy atom effect, electrons of a phosphorescent material may span multiple energy levels to form a triplet excited state, resulting in increased phosphorescence emission, simultaneously reducing fluorescent intensity. Thus, phosphorescent materials exhibit three times the luminescence of fluorescents. Consequently, development of a phosphorescent material with high luminescent efficiency is a critical factor in improvement of luminescent performance of organic electroluminescent devices.

SUMMARY

The invention provides an organometallic complex having formula (I):

(I)

, wherein M is a transition metal with an atomic number greater than 40 comprising Ir, Os, Pt, Pd, Re, or Ru, is a substituted or non-substituted heterocyclic ring containing at least one nitrogen atom, and is any bidentate ligand comprising bipyridyl groups.

The invention also provides an organic light-emitting diode comprising a cathode, an anode, and an emitting layer, wherein the emitting layer is installed therebetween and comprises the disclosed organometallic complex.

The invention further provides a display comprising the disclosed organic light-emitting diode and a drive circuit coupled to the organic light-emitting diode to drive the organic light-emitting diode.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION

The invention provides an organometallic complex having formula (I):

(I)

In formula (I), M is a transition metal with an atomic number greater than 40, such as Ir, Os, Pt, Pd, Re, or Ru.

is a substituted or non-substituted heterocyclic ring containing at least one nitrogen atom, such as pyrazole, pyrrole, imidazole, or triazole, and substituted groups of the heterocyclic ring comprise aromatic groups, ester groups, alkyl groups, alkyl halide groups, or halogen atoms.

is any bidentate ligand comprising bipyridyl groups, such as wherein R is an alkyl group.

The specific organometallic complexes provided by the invention comprise wherein R is an alkyl group, and the solvent may be acetonitrile. After air-extraction and filtration, collected solids are washed with small quantity of solvent such as n-hexane. A Pt complex precursor containing a bipyridyl group is prepared after extracting the solvent. Next, the Pt complex precursor, a coordination salt, and solvent are mixed in a flask with thermal reflux for about 5~8 hours. The coordination salt comprises a substituted or non-substituted heterocyclic ring salt containing at least one nitrogen atom, such as pyrazole, pyrrole, imidazole, or triazole, and substituted groups thereof comprise aromatic groups, ester groups, alkyl groups, alkyl halide groups, or halogen atoms. After air-extraction and filtration, collected solids are washed with a small quantity of solvent such as n-hexane. After extracting the solvent and re-crystallization with solvent such as dichloromethane, a Pt complex containing two coordination groups and a bipyridyl group is prepared.

The organometallic complex is a phosphorescent dopant.

The compound of formula (I) is prepared as follows. First, a precursor, such as Pt(DMSO)$_2$Cl$_2$, of a Pt complex containing leaving groups, such as Cl$_2$, is prepared by general synthesis. Next, the Pt complex precursor, a bipyridyl compound, and solvent are mixed with thermal reflux for about 2~4 hours. The bipyridyl compound comprises

Pt ions are suitable for use as a metal center of a complex due to strong bonding with coordination compounds, enduring excited state, and high luminescent efficiency. Additionally, the combination of a Pt complex precursor containing various bipyridyl groups and various pyrazole coordination salts is unknown in current technology, providing a novel organic phosphorescent material.

The Pt complex provides stability in air and thermal, high yield, and rapid reaction capability. Additionally, various emission spectrums thereof may also be produced by altering various electron-donating or electron-withdrawing groups in coordination groups.

The invention also provides an organic light-emitting diode comprising a cathode, an anode, and an emitting layer, wherein the emitting layer is installed therebetween and comprises the foregoing organometallic complex as formula (I).

The cathode or anode is a transparent electrode, that is, may have the same or different materials, such as metal, metal alloy, or transparent metal oxide. The metal may be Al, Ca, Ag, Ni, Cr, Ti, or Mg. The metal alloy comprises Mg—Ag alloy. The transparent metal oxide comprises ITO, AZO, ZnO, InN, or SnO$_2$.

The organic light-emitting diode further comprises an electron transport layer or an electron injection layer installed between the cathode and the emitting layer and a hole transport layer or a hole injection layer installed between the anode and the emitting layer. The electron transport layer comprises t-Bu-PBD, Alq$_3$, BeBq, TAZ, Almq$_3$, BAlq, or TPBI. The electron injection layer may comprise LiF or Li$_2$O. The hole transport layer comprises HTM2, TPD, NPB, PPD, TBPB, spiro-TAD, spiro-NPB, TPTE2, TPTE1, NTPA, or DNPD. The hole injection layer comprises BPhen BCP, BAlq, CF-X, TAZ, or CF-Y. The foregoing abbreviations represent the following structures.

CBP

TCTA

CzTT

TPBI

TAZ

BAlq

-continued

MCP

UGH1

UGH2

UGH3

Bphen

BCP

Balq

CF-X

-continued

TAZ

CF-Y

HTM2

-continued

NPB

PPD

TBPB spiro-TAD spiro-NPB

TPTE2

-continued

TPTE1

NTPA

DNPD

-continued

Figure 1:
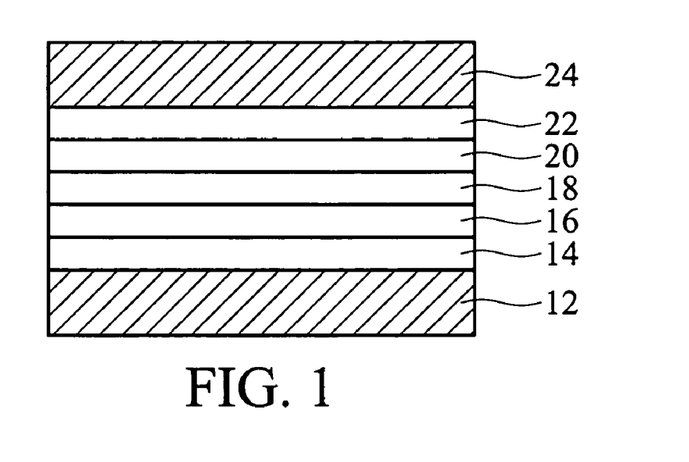
FIG. 1. is a cross section of an organic light-emitting diode of the invention.

Referring to FIG. 1, a method of fabricating an organic light-emitting diode is provided. First, an anode 12 is provided. Next, a hole injection layer 14, a hole transport layer 16, an emitting layer 18, an electron transport layer 20, an electron injection layer 22, and a cathode 24 are evaporated on the anode 12 in order. Finally, the diode is packaged to form an organic light-emitting device.

The invention also provides a display comprising the disclosed organic light-emitting diode and a drive circuit coupled to the organic light-emitting diode driving the organic light-emitting diode. The drive circuit comprises a thin film transistor.

Figure 2:
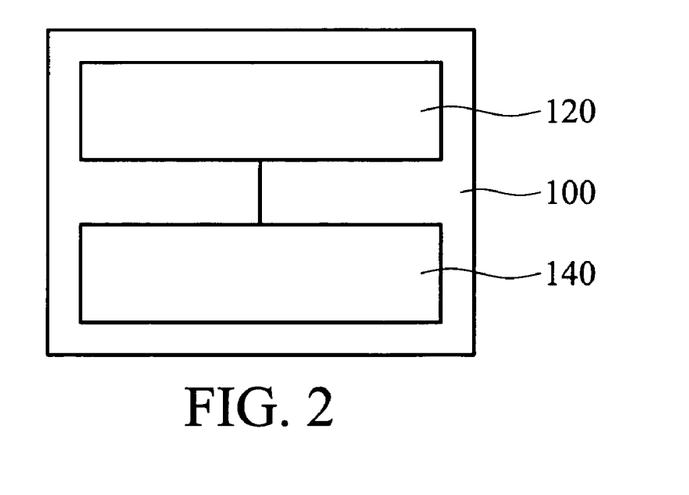
FIG. 2 is a top view of a display of the invention.

Referring to FIG. 2, a display provided by the invention is disclosed. The display 100 comprises an organic light-emitting diode 120 and a drive circuit 140 coupled to the organic light-emitting diode 120 driving the organic light-emitting diode 120.

EXAMPLES

Example 1 (Preparation of Compound 1)

(1) 3 g K$_2$PtCl4 (7.23 mmole) and 30 ml water were added to a 50 ml round-bottomed flask and stirred at room temperature for 10 min. Next, 1.7 g Me$_2$SO (21.7 mmole) was gradually dropped into the flask and white acicular solids were then precipitated. After air-extraction and filtration, the white solids were washed with n-hexane several times. Finally, 2.4 g Pt(Me$_2$SO)$_2$Cl$_2$ white acicular solids were prepared and the yield thereof was 80%. The reaction according to step (1) was (2) 1 g Pt(Me$_2$SO)$_2$Cl$_2$ (2.37 mmole) and 0.37 g 2,2'-bipyridine (2.37 mmole) were dissolved in acetonitrile with reflux for 3 hours. After air-extraction and filtration, collected solids were washed with n-hexane several times. After removing n-hexane, 0.85 g Pt(2,2'-bipyridinyl)Cl$_2$ (2.01 mmole) yellow solids were prepared and the yield thereof was 85%. The Pt(2,2'-bipyridinyl)Cl$_2$ was a precursor of a Pt complex. The reaction according to step (2) was (3) 0.15 g 3-trifluoromethyl pyrazole (1.1 mmole) and 0.15 g KOH (2.54 mmole) were dissolved in THF and stirred at room temperature for 2 hours to form 3-trifluoromethyl pyrazole salt, as a coordination group of a subsequently formed Pt complex. Next, the 3-trifluoromethyl pyrazole salt, 0.22 g Pt(2,2'-bipyridinyl)Cl$_2$ (0.52 mmole), and 30 ml acetonitrile were mixed in a 100 ml round-bottomed flask with reflux for 6 hours. After air-extraction and filtration, collected solids were washed with n-hexane several times. After removing n-hexane and re-crystallization with dichloromethane, 0.21 g light yellow compound 1 (0.34 mmole) was prepared and the yield thereof was 65%. The reaction according to step (3) was

Example 2

(Fabrication of Organic Light-Emitting Diode)

Referring to FIG. 1, a method of fabricating an organic light-emitting diode (device A) is disclosed as follows. First, an ITO anode 12 was provided on a substrate and treated with O$_3$. Next, material was evaporated on the ITO anode 12 to form a hole injection layer 14. NPB was evaporated on the hole injection layer 14 to form a hole transport layer 16. Compound 1 (dopant) and CBP (host) were then co-evaporated on the hole transport layer 16 to form an emitting layer 18.

The doping concentration thereof was 7~26%. Next, Balq was evaporated on the emitting layer 18 to form an electron transport layer 20. Next, LiF was evaporated on the electron transport layer 20 to form an electron injection layer 22. Finally, Al was evaporated on the electron injection layer 22 to form a cathode 24. The invention also provides devices B (16%), C (22%), and D (26%) with different doping concentrations.

Figure 3A:
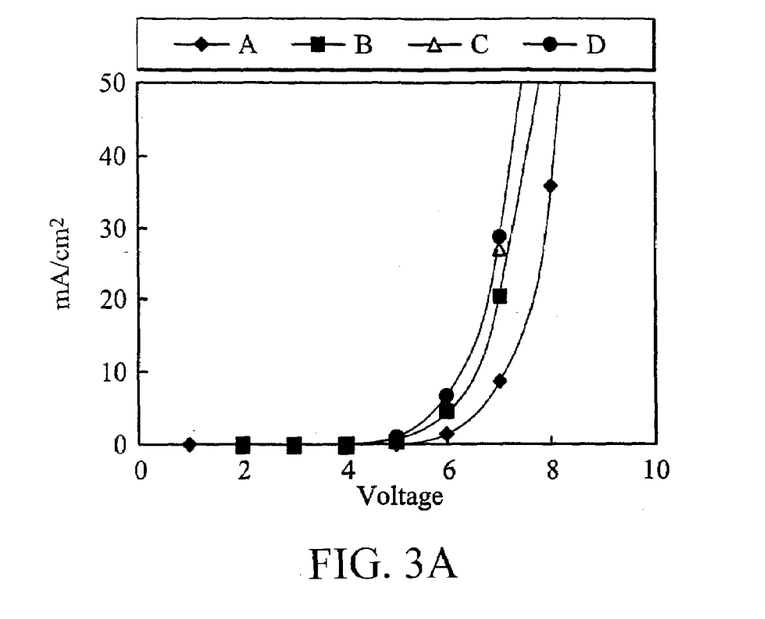
FIGS. 3A and 3B show a comparison between electron injection performance of organic light-emitting diodes of the invention.
Figure 3B:
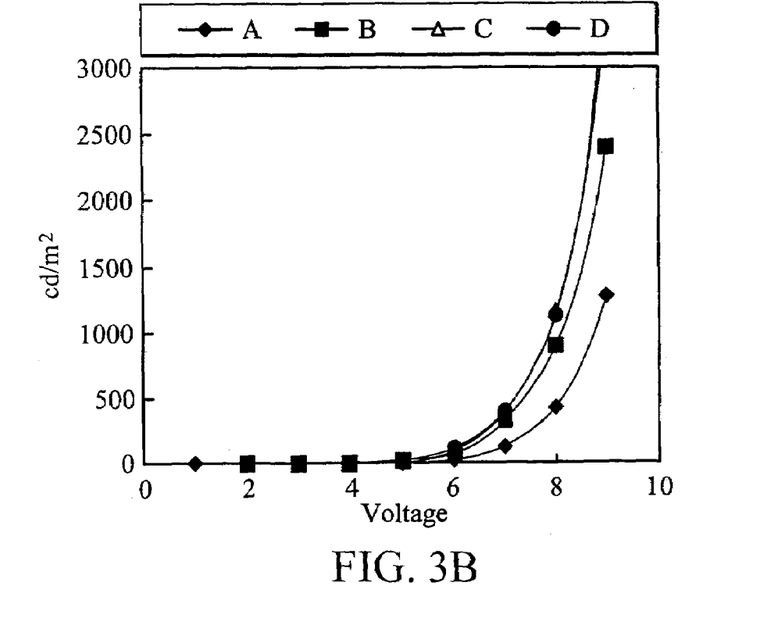
Figure 4A:
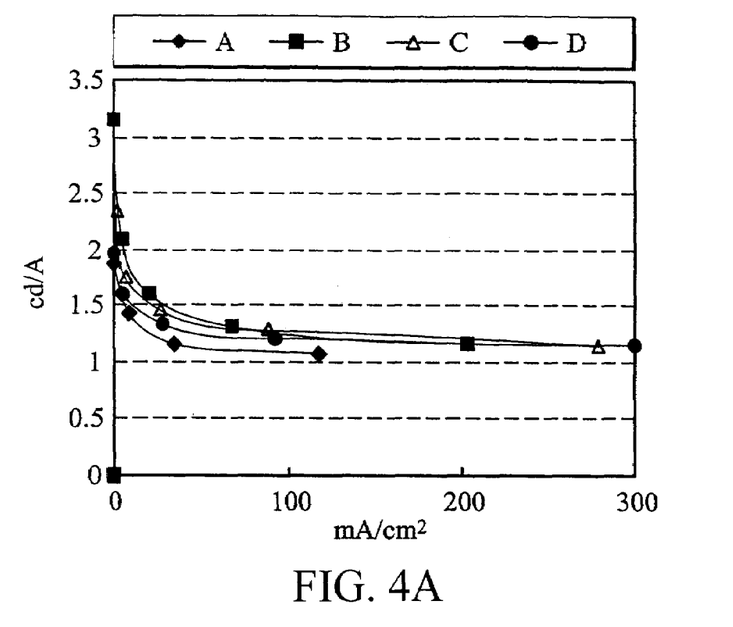
FIGS. 4A and 4B show a comparison between luminescent efficiency of organic light-emitting diodes of the invention.
Figure 4B:
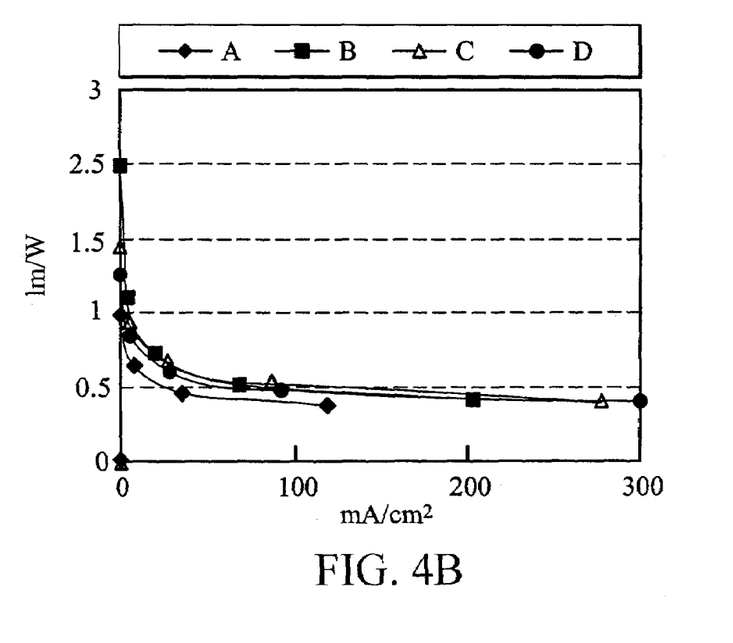
Figure 5A:
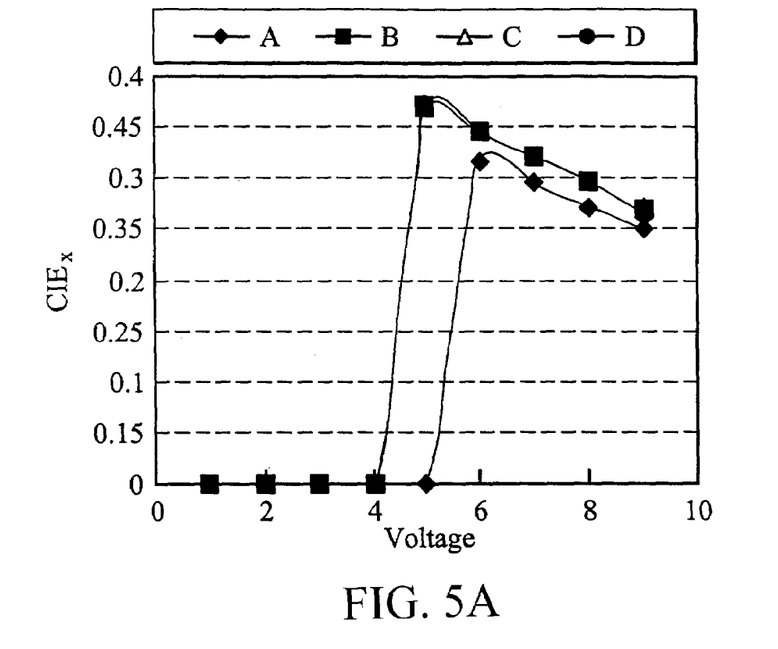
FIGS. 5A and 5B show a comparison between CIEx and CIEy values of organic light-emitting diodes of the invention.
Figure 5B:
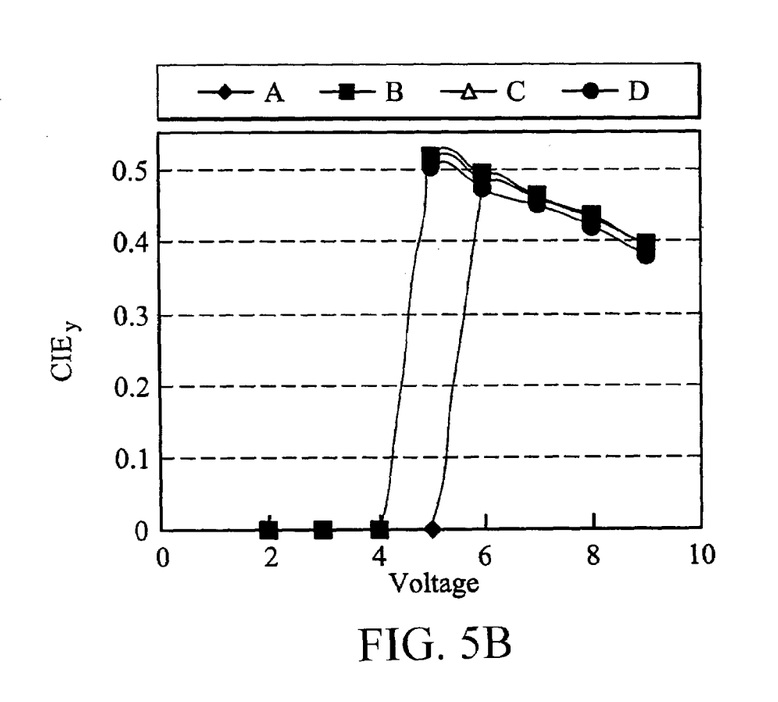

Referring to FIGS. 3A and 3B, various electrical performance of devices A~D were compared. The results indicate that electron injection capability is improved as doping concentration increases. Thus, device D exhibits the best electron injection capability. Referring to FIGS. 4A and 4B, various luminescent efficiency of devices A~D were compared. The results indicate that device B with doping concentration of 16% has the highest luminescent efficiency of 3.2 cd/A or 2.51 m/W. Referring to FIGS. 5A and 5B, CIEx and CIEy spectrums of devices A~D were compared. The results indicate that CIEx and CIEy values decrease as operating voltage increases.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An organometallic complex having formula (III):

wherein M is Pt and is any bidentata ligand comprising bipyridyl groups.

2. The organometallic complex as claimed in claim 1, wherein the organometallic complex is represented by

3. The organometallic complex as claimed in claim 1, wherein the organometallic complex is represented by 4. The organometallic complex as claimed in claim 1, wherein the organometallic complex is represented by

5. The organometallic complex as claimed in claim 1, wherein the organometallic complex is represented by 6. The organometallic complex as claimed in claim 1, wherein comprises wherein R is an alkyl group.

7. The organometallic complex as claimed in claim 1, wherein the organometallic complex is a phosphorescent dopant.

8. An organometallic complex represented by formula (II):

(II)

9. An organometallic complex represented by formula (IV):

(IV)

wherein M with a coordination number of four is Pt and is any bidentate ligand comprising bipyridyl groups.

10. The organometallic complex as claimed in claim 9, wherein the organometallic complex is represented by

11. The organometallic complex as claimed in claim 9, wherein the organometallic complex is represented by

12. The organometallic complex as claimed in claim 9, wherein comprises wherein R is an alkyl group.

13. The organometallic complex as claimed in claim 9, wherein the organometallic complex is a phosphorescent dopant.

* * * * *